United States Patent [19]

Miyamoto

[11] Patent Number: 4,942,438
[45] Date of Patent: Jul. 17, 1990

[54] COMPOUND SEMICONDUCTOR FIELD-EFFECT TRANSISTOR

[75] Inventor: Hironobu Miyamoto, Tokyo, Japan
[73] Assignee: NEC Corporation, Japan
[21] Appl. No.: 248,545
[22] Filed: Sep. 23, 1988
[30] Foreign Application Priority Data Sep. 25, 1987 [JP] Japan ................................ 62-242143

[51] Int. Cl.$^5$ ............................................. H01L 29/80
[52] U.S. Cl. ........................................ 357/16; 357/22; 357/4; 357/15
[58] Field of Search ................... 357/22 I, 22 J, 4, 15, 357/16, 4 SL

[56] References Cited
FOREIGN PATENT DOCUMENTS 59-10278  1/1984  Japan .
62-81063  4/1987  Japan ...................................... 357/4

OTHER PUBLICATIONS

Schubert et al, "IEEE Transactions on Electron Devices", vol. ED-33, No. 5, May 1987, pp. 625–632.

Primary Examiner—Andrew J. James
Assistant Examiner—David Soltz
Attorney, Agent, or Firm—Laff, Whitesel, Conte & Saret

[57] ABSTRACT

A compound field-effect transistor has a substrate with an epitaxial layer formed thereon. The layer includes two planar-doped layers, each of which is one approximately atom thick and is formed by atomic-planar-doping in two dimensions. The space separating the two planar-doped layers is equal to or less than a mean free path of electrons. A large majority of the carrier electrons are present at the center of the space between the two planar-doped electrons, which suppresses the scattering of impurity ions. As a result, there is an ultra-high-speed transistor.

26 Claims, 2 Drawing Sheets

COMPOUND SEMICONDUCTOR FIELD-EFFECT TRANSISTOR

BACKGROUND OF THE INVENTION

The present invention relates to a compound semiconductor field-effect transistor such as GaAs FET, InP FET or InGaAs FET, and more particularly to an atomic planar-doped field-effect transistor which has an atomic planar-doped layer in the channel region.

The compound semiconductor field-effect transistors are featured by their high carrier mobilities and high velocities in carrier saturation. They have been widely employed as high-frequency discrete transistors or in high-speed IC devices. However there is a demand to further increase their operation frequencies and operation speeds. For that purpose, it is required to make the device size smaller and the channel layer thinner, thereby increasing the transconductance while maintaining the gate-source breakdown voltage and the current driving capability. Schubert et al. have proposed the atomic planar-doped field-effect transistor to meet the requirements, the Schubert et al proposal being disclosed in IEEE TRANSACTIONS ON ELECTRON DEVICES, Vol. ED-33, No. 5, May 1986, pp. 625–632. The proposed FET has a planar-doped layer within its channel region between the source and the drain that is an atomic monolayer where ionized donors extend two-dimensionally. This structure realizes a thinned channel while maintaining the gate breakdown voltage.

In the proposed FET, however, ion scattering causes a scattering of carrier electrons, which decreases the mobility at a low electric field. The decreased mobility at a low electric field causes an increase in the parasitic resistance of the device. Moreover, the overshoot effect is decreased due to an increase in ion scattering. It is impossible to expect a substantial improvement of the characteristics even if a device size is reduced.

Ploog et al. have presented a solution of the above problems, in which the atomic planar-doped layer is separated from the electron channel by the use of a heterojunction. The Ploog et al solution is described in the Journal of Crystal Growth, Vol. 81, 1987, p.304. However, the use of a heterojunction gives rise to another problem because the device characteristics become unstable due to a deep level which is generally present in heterojunction devices.

SUMMARY OF THE INVENTION

An object of the present invention is to provide a stable planar-doped field-effect transistor for high-frequency and high-speed operation in which the mobility at a low electric field is enhanced without using a heterojunction.

The planar-doped field-effect transistor according to the present invention is characterized by having two planar-doped layers in a channel region between a source and a drain. Each of the two planar-doped layers, is formed by atomic-planar-doping, that is, by doping impurities two-dimensionally, at spaced intervals substantially equal to or less than a mean free path of electrons.

In the structure of the present invention, a large majority of carrier electrons are present at a center of the interval between the two planar-doped layers, especially separated from the ionized donors at the planar-doped layers. Therefore, the carrier electrons are hardly affected by a scattering of the impurity ions and the carrier mobility at a low electric field is not reduced. Since the scattering due to the ion scattering is suppressed, the overshoot effect of saturation velocity of electrons appears in the device whose size is highly decreased. Thus, the operating speed is greatly improved. It is possible to realize an ultra-high-speed device.

DESCRIPTION OF THE INVENTION

Figure 1:
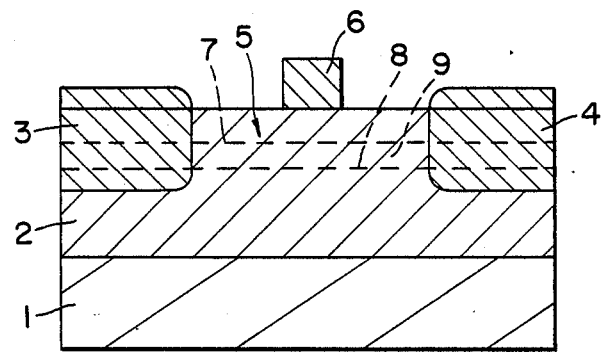
FIG. 1 is a schematic sectional view of a planar-doped FET according to an embodiment of the present invention.

Referring to FIG. 1, the planar-doped field-effect transistor according to an embodiment of the present invention comprises a semi-insulating GaAs substrate 1, an undoped $p^-$-GaAs epitaxial layer 2 formed on the substrate 1, a source 3 and a drain 4 formed on the epitaxial layer 2 and spaced apart from each other to leave a channel region 5 therebetween at the surface portion of the expitaxial layer 2. A gate electrode 6 of Al, Ti-Al or W-Si is formed on the surface of the channel region 5. Two atomic planar-doped layers 7 and 8 are formed within the channel region 5. The planar-doped layers 7 and 8 are formed through a conventional method by two-dimensionally doping impurity atoms such as Si, Se or S. The upper planar-doped layer 7 may be formed 100 to 500 Å below the surface of the channel region 5. The interval between the two planar-doped layers 7 and 8, that is, a thickness of the portion 9 between the two layers 7 and 8, is for example 70 Å, which is about a mean free path of electron, or less. Each of an the planar-doped layers 7 and 8 has a thickness which is substantially equal to a size of one atom of the doped impurity. Instead of a GaAs semi-insulating substrate, an InP semi-insulating substrate may be used, with an epitaxial layer thereon of InP or InGaAs in which two planar-doped layers of Si, for example, are formed.

Figure 4:
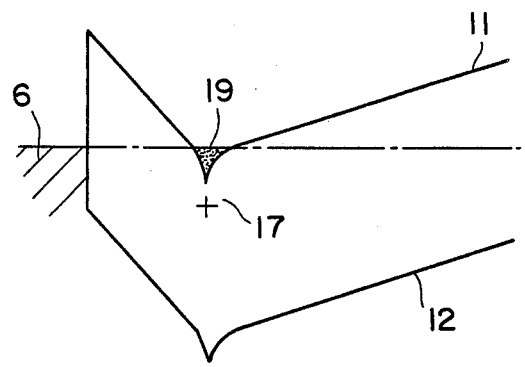
FIG. 4 is an energy band diagram of a conventional planar-doped FET.

A conventional planar-doped FET with a single planar-doped layer has an energy-band diagram as shown in FIG. 4 in which a conduction band 11 and a valence band 12 have V-shaped recesses at a position where the single planar-shaped layer is formed. The V-shaped recess in the conduction band 11 acts as a potential well in which carrier electrons 19 exist locally in the vicinity of the ionized donors 17. The field strength near the gate electrode 6 is far smaller than the field strength in the case of uniform doping. Thus, it has become possible to minimize the thickness of the channel region while maintaining the gate breakdown voltage.

Figure 5:
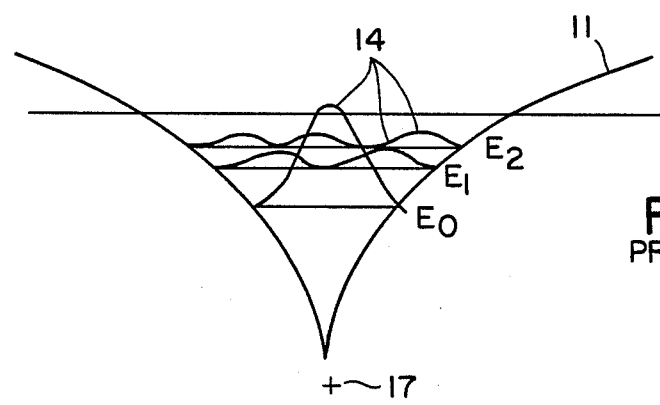
FIG. 5 is a partial, enlarged view of the energy-band diagram of FIG. 4 at a channel region of the conventional planar-doped FET.

FIG. 5 is an enlarged view of the V-shaped potential well portion in FIG. 4. Electrons have quantized energy levels $E_0$, $E_1$, $E_2$ . . . . The existing probabilities ($\psi \cdot \psi^*$) 14 of carrier electrons have a peak at the same spatial location of the ionized donors 17. The distribution of carrier electron concentration is shown in FIG. 6 wherein the axis of abscissas represents the channel depth and the axis of ordinate represents the carrier electron concentration 114 and ionized donor concentration 117.

Figure 6:
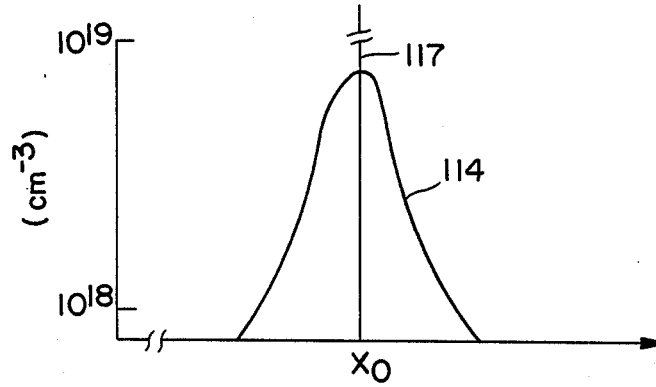
FIG. 6 shows distributions of the carrier electron concentration and ionized donor concentration in the depthwise direction of a channel layer of the conventional planar-doped FET.

As will be clear from FIG. 6, the distribution 114 of carrier electrons is about the same location as the location 117 of the ionized donors, that is, the location $X_0$ of the planar-doped layer. Therefore scattering due to ion scattering increases and the carrier mobility at low electric field lowers. However, it has heretofore been considered that, since the transconductance of a very small FET having a channel length of 1 μm or less is determined by a velocity $V_s$ in electron saturation and by the channel depth, the decrease in the mobility at a low electric field due to ionized impurity scattering gives rise to no problem in regard to the device characteristics. However, there is a problem that a lowered mobility at low electric field causes an increase in the parasitic resistance of the device. There is another problem that; if ion scattering increases, the overshoot effect decreases. It is impossible to expect a substantial improvement in the characteristics even if miniaturization is achieved.

Figure 2:
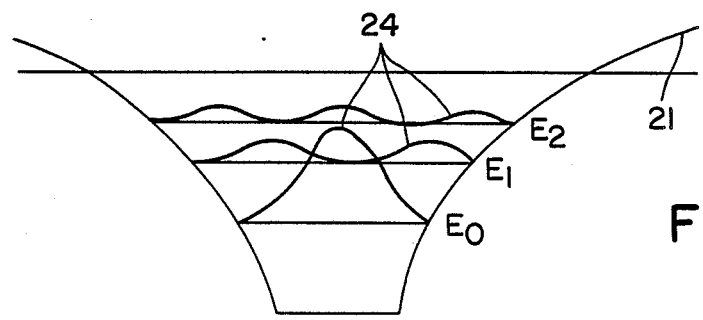
FIG. 2 is an enlarged view of an energy-band diagram at a channel region of the planar-doped FET shown in FIG. 1.
Figure 3:
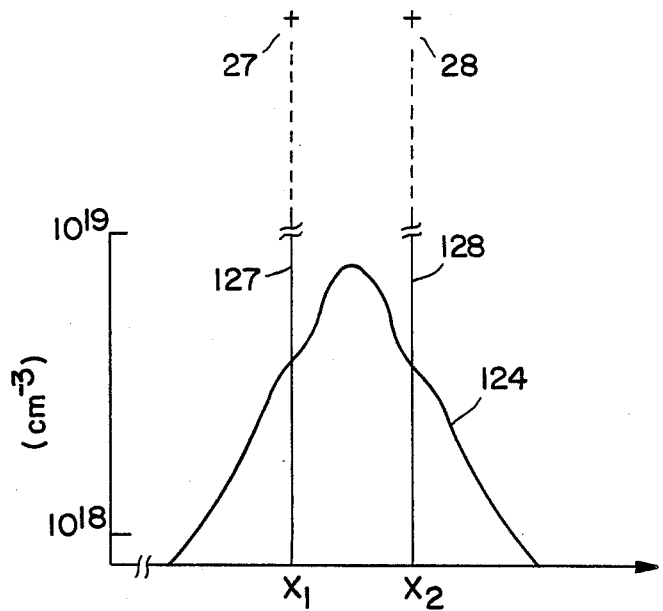
FIG. 3 shows the distributions of the carrier electron concentration and ionized donor concentration in the depth-wise direction of the channel region of the planar-doped FET shown in FIG. 1.

Referring now to FIG. 2, the conduction band 21 at the channel region 5 (FIG. 1) of the inventive transistor has a recessed potential well portion with a flat bottom between the locations of the ionized donors 27 and 28, that is, the locations of the two planar-doped layers 7 and 8 whose depths are $X_1$ and $X_2$, respectively, as shown in FIG. 3.

The recessed potential well portion has the quantized energy levels $E_0$, $E_1$, $E_2$, . . . . The existing possibilities of carrier electrons ($\psi \cdot \psi$) are indicated by 24. A large majority of the carrier electrons exist in the ground state $E_0$ and particularly at the center of the interval $(X_2 - X_1)$ between the two planar-doped layers 7 and 8. The distribution 124 of the carrier electrons and the distributions 127 and 128 of the ionized donors 27 and 28 are shown in FIG. 3 whose absissa represents the channel depth. As is clear from FIG. 3, a greater part of the carrier electrons are spatially separated from the ionized donors. Hence the effect of Coulomb scattering of the donor ions upon the carrier electrons is suppressed. There is no lowering in the mobility at a low electric field.

EMBODIMENT 1

On a semi-insulating GaAs substrate 1 (FIG. 1), an undoped p⁻-GaAs layer (a part of 2 below 8) was grown by the molecular beam epitaxy (MBE) method, to a thickness 0.8 μm. The layer 2 because P⁻-type spontaneously, with an impurity (mainly carbon) concentration of $1 \times 10^{-14}$ cm$^{-3}$. When the thickness reached 0.8 μm, the fluxing of Ga in MBE was stopped and a fluxing of Si was initiated for such a period of time that a sheet density $1 \times 10^{-12}$ cm$^{-2}$ Si was achieved, thereby forming the lower planar-doped layer 8. Then, the fluxing of Si was replaced by a fluxing of Ga. A P⁻-GaAs layer 9 was grown to a thickness of 70 Å. The fluxing of Ga was again stopped and a fluxing of Si was applied for such a period of time that a sheet density of $1 \times 10^{-12}$ cm$^{-2}$ was achieved, thereby forming the upper planar-doped layer 7. Thereafter, a P⁻-GaAs layer (the upper part of 2 above 7) was grown to a thickness of 300 Å. Then, a gate electrode 6 having a gate length of 0.5 μm was formed of Al. At the portions intended for source and drain, AuGe alloy and then Ni were deposited and were allogey at 450° C. to form source and drain ohmic electrodes 3 and 4. The distances between the edges of the source and drain and the opposing edges of the gate were 1 μm, respectively.

The Hall measurement was conducted for the completed transistor and the result showed that the mobility was 4000 cm²/V.sec, which was considerably higher than the value of a conventional transistor. Moreover, it was revealed that the cut-off frequency was 35 GHz, which was closer to the value of a heterojunction high-mobility transistor beyond the value 20 GHz of the conventional GaAs MESFET having the same size as the embodiment.

EMBODIMENT 2

Atomic monolayers were grown, one layer by one layer, through the atomic-layer-controlled-epitaxy (ALE) method reported by Usui et al. in Japan Journal of Applied Physics Letter, Vol. 25, page 212 in 1986.

At first, a high-resistance GaAs layer (a part of 2 below 8 in FIG. 1) was grown on a semi-insulating GaAs substrate 1 to a thickness of 0.8 μm, by the conventional VPE method. Then, by means of the ALE method, 35 layers of GaAs monolayers were grown on the high-resistance GaAs layer. One atomic monolayer of Se was grown at a sheet density of $1 \times 10^{12}$ cm$^{-2}$ to form the lower planar-doped layer 8. The GaAs monolayers 9 were grown again in the number of 25 layers. Then Se was absorbed on the surface at a sheet density of $1 \times 10^{12}$ cm$^{-2}$ to form the upper planar-doped layer 7. Thereafter, the GaAs monolayers were grown in the number of 110 layers. Then ohmic electrodes 3 and 4 and a gate electrode 6 similar to those in the embodiment 1 were formed.

In this device also, the mobility was 4000 cm²/V.sec. which is considerably higher than the value of the conventional FET. In addition, it was possible to effect atomic scale control of the interval between the two-dimensionally doped atomic layers 7 and 8. There were great improvements in uniformity within the plane of the substrate and also in reproducibility. The cut-off frequency of the FET prepared in this way was also enhanced to 35 GHz, which is the value 20 GHz of the conventional GaAs MESFETs having the same configuration. The FET of the embodiment 2 was obtained with excellent reproducibility.

I claim:

1. A field effect transistor comprising:
    a source and a drain;
    a channel region between said source and said drain;
    a gate formed on said channel region; and
    two planar-doped layers, each of said planar-doped layers having two-dimensionally doped impurities, said planar-doped layers being located within said channel region, being in contact with both said source and said drain, and being separated by an interval which is equal to or smaller than about 70 Å.

2. A field effect transistor as claimed in claim 1, wherein said channel region is formed in a compound semiconductor layer.

3. A field effect transistor as claimed in claim 1, wherein each of said planar-doped layers has a thickness which is substantially equal to a size of one atom of said doped impurity.

4. A field effect transistor as claimed in claim 2, wherein each of said planar-doped layers has a thickness which is substantially equal to a size of one atom of said doped impurity.

5. A field effect transistor as claimed in claim 2, wherein said internal is about 68-70 Å.

6. A field effect transistor as claimed in claim 1, wherein a large majority of carriers are present at a center of said internal between said two planar-doped layers.

7. A field effect transistor as claimed in claim 2, wherein an upper one of said two planar-doped layers is located 100 to 500 Å below the surface of said channel region.

8. A field effect transistor as claimed in claim 2, wherein said compound semiconductor layer is a GaAs layer.

9. A field effect transistor as claimed in claim 8, wherein said GaAs layer is an GaAs epitaxial layer formed on a semi-insulating GaAs substrate.

10. A field effect transistor as claimed in claim 8, wherein said doped impurity is selected from a group consisting of Si, Se, and S.

11. A field effect transistor as claimed in claim 8, wherein a material of said gate is selected from a group consisting of Al, Ti-Al, and W-Si.

12. A field effect transistor as claimed in claim 2, wherein said compound semiconductor layer is selected from a group consisting of an InP layer formed on an InP semi-insulating substrate and an InGaAs layer formed on an InP semi-insulating substrate.

13. A field effect transistor as claimed in claim 12, wherein said doped impurity is Si.

14. A field effect transistor comprising:
a semiconductor substrate;
a semiconductor channel region formed on said semiconductor substrate;
a source and a drain located on opposite sides of said channel region;
a gate electrode formed on the surface of said channel region;
a first atomic planar-doped layer formed within said channel region at a first depth from said surface of said channel region and extending between said source and said drain; and
a second atomic planar-doped layer formed within said channel region at a second depth from said surface of said channel region and extending between said source and said drain in parallel with said first atomic planar-doped layer, said second depth being deeper than said first depth and the distance between said first and second atomic planar-doped layers being equal to or smaller than substantially 70 Å.

15. A field effect transistor as claimed in claim 14, wherein said semiconductor substrate is a compound semiconductor substrate, said semiconductor channel region being a compound channel region.

16. A field effect transistor as claimed in claim 14, wherein each of said atomic planar-doped layers has a thickness which is substantially equal to a size of one atom.

17. A field effect transistor as claimed in claim 15, wherein each of said atomic planar-doped layers has a thickness which is substantially equal to a size of one atom.

18. A field effect transistor as claimed in claim 15, wherein said distance between said first and second atomic planar-doped layers is about 68-70 Å.

19. A field effect transistor as claimed in claim 14, wherein a large majority of carriers are present at a center portion between said first and second atomic planar-doped layers.

20. A field effect transistor as claimed in claim 15, wherein said first depth is in the range of approximately 100 to 500 Å.

21. A field effect transistor as claimed in claim 15, wherein said compound semiconductor channel region is a GaAs channel region.

22. A field effect transistor as claimed in claim 21, wherein said compound semiconductor substrate is a semi-insulating GaAs substrate.

23. A field effect transistor as claimed in claim 21, wherein an impurity doped into said first and second atomic planar-doped layers is selected from a group consisting of Si, Se, and S.

24. A field effect transistor as claimed in claim 21, wherein a material of said gate is selected from a group consisting of Al, Ti-Al, and W-Si.

25. A field effect transistor as claimed in claim 15, wherein said compound semiconductor substrate is an InP semi-insulating substrate, said compound semiconductor channel region being selected from a group consisting of an InP channel region and an InGaAs channel region.

26. A field effect transistor as claimed in claim 25, wherein an impurity doped in said first and second planar-doped layers is Si.

* * * * *